US006797997B2

United States Patent
Hata

(12) United States Patent
(10) Patent No.: US 6,797,997 B2
(45) Date of Patent: Sep. 28, 2004

(54) SEMICONDUCTOR MEMORY APPARATUS

(75) Inventor: Yoji Hata, Tateyama (JP)

(73) Assignee: UMC Japan, Chiba (JP)

( * ) Notice: Subject to any disclaimer, the term of this patent is extended or adjusted under 35 U.S.C. 154(b) by 0 days.

(21) Appl. No.: 10/609,478

(22) Filed: Jul. 1, 2003

(65) Prior Publication Data
US 2004/0007719 A1 Jan. 15, 2004

(30) Foreign Application Priority Data
Jul. 3, 2002 (JP) ........................................ 2002-194842

(51) Int. Cl.⁷ ......................... H01L 31/0328; G11C 7/00

(52) U.S. Cl. ........................ 257/201; 365/145; 365/201; 365/205

(58) Field of Search ................................ 257/198, 201; 365/200, 180; 265/145, 201, 198, 171, 205

(56) References Cited

U.S. PATENT DOCUMENTS

| | | | | |
|---|---|---|---|---|
| 5,148,399 A | * | 9/1992 | Cho et al. | 365/205 |
| 5,864,152 A | * | 1/1999 | Mori | 257/198 |
| 6,151,244 A | * | 11/2000 | Fujino et al. | 365/149 |
| 6,411,557 B2 | * | 6/2002 | Terzioglu et al. | 365/200 |
| 6,456,525 B1 | * | 9/2002 | Perner et al. | 365/171 |

* cited by examiner

Primary Examiner—Long Pham
Assistant Examiner—(Vickki) Hoa B. Trinh
(74) Attorney, Agent, or Firm—Crowell & Moring LLP

(57) ABSTRACT

A semiconductor memory apparatus that stores data by accumulating charges in its capacitor is provided for allowing itself to be operated at a low potential and at a high speed. In the semiconductor memory apparatus, before performing a precharge by a precharging circuit 10 for the next cycle of read and write, a forced step-down circuit 11 previously lowers the potential of the bit line BL charged on the high side to a level within the range of preventing data of positive charges written and stored in a memory cell MC from being disappeared.

18 Claims, 3 Drawing Sheets

[FIG. 1]
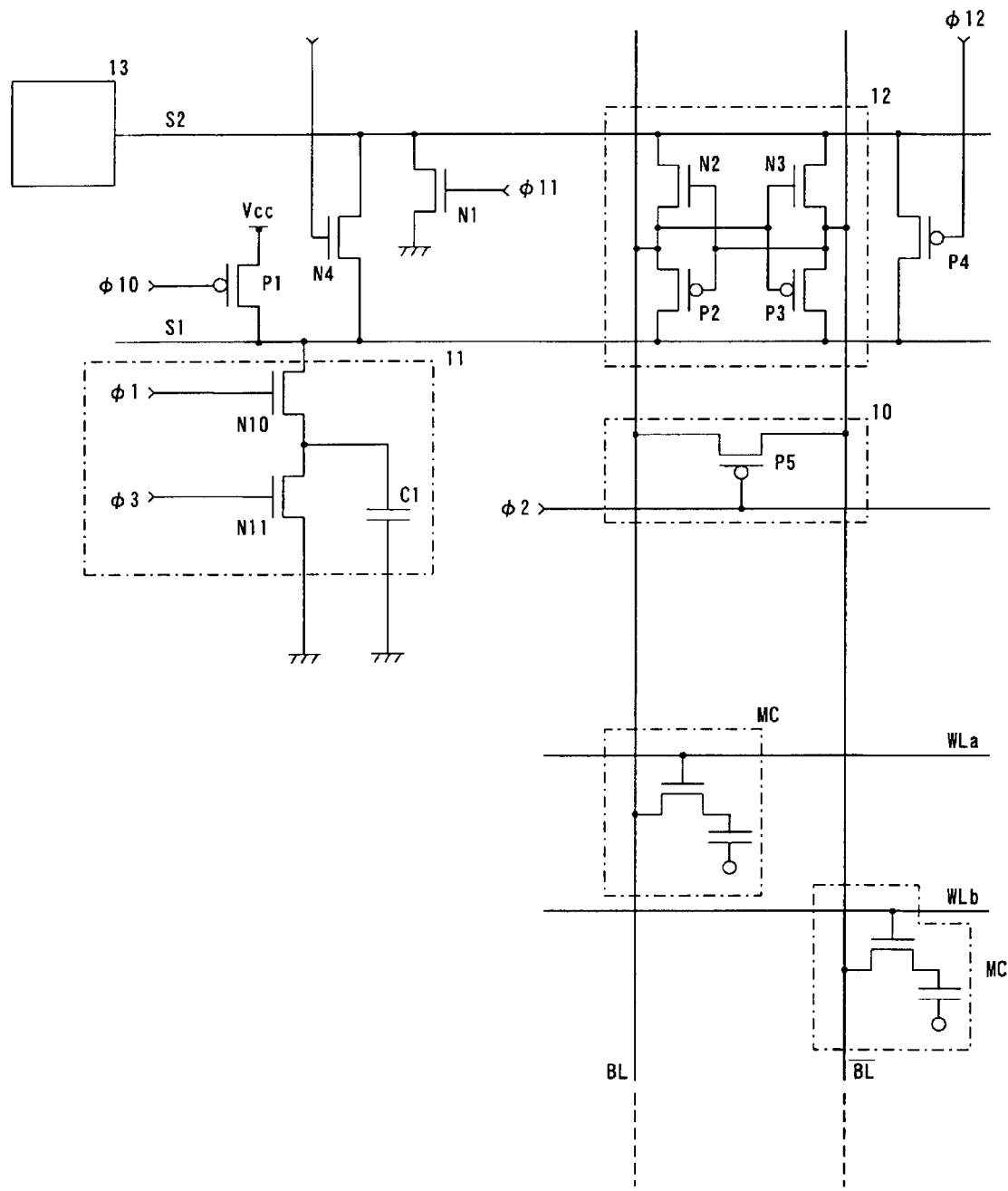

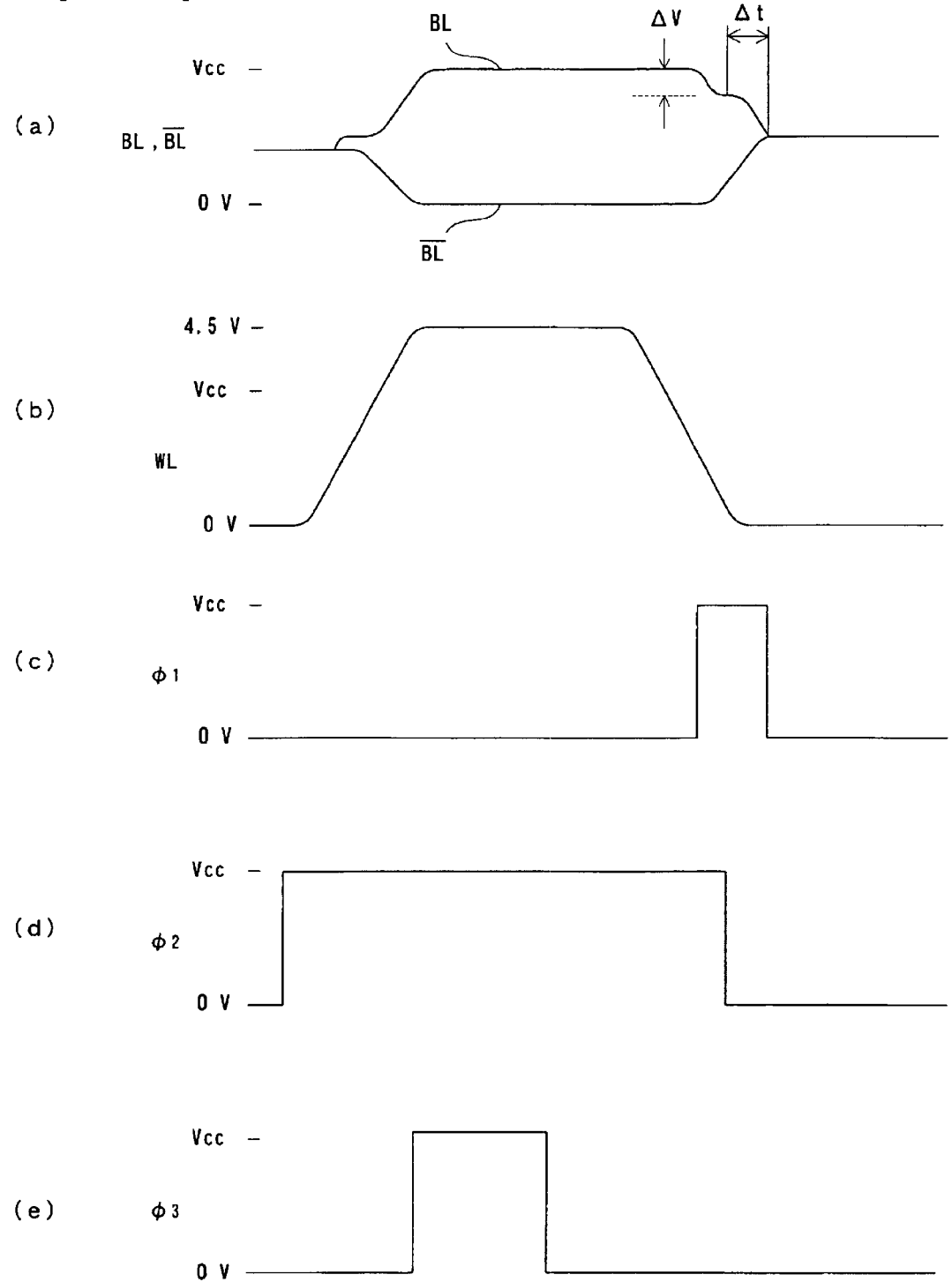

[FIG. 3]
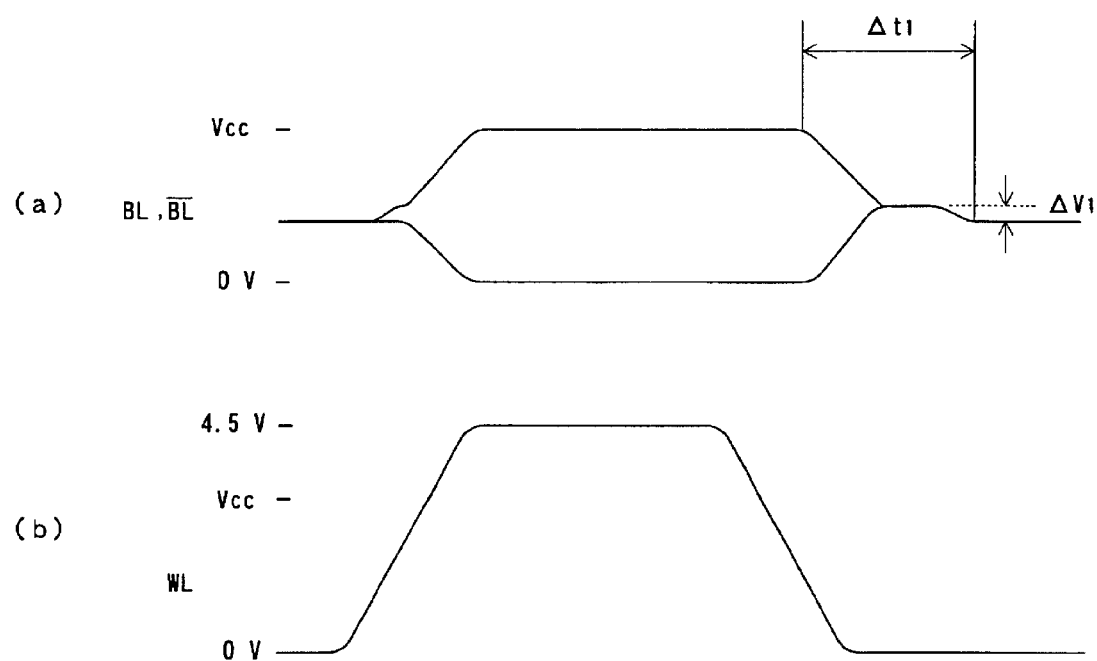

SEMICONDUCTOR MEMORY APPARATUS

BACKGROUND OF THE INVENTION

FIELD OF THE INVENTION

The present invention relates to a semiconductor memory apparatus, in particular which stores data by accumulating charges in its capacitor.

DESCRIPTION OF THE RELATED ART

In a conventional semiconductor memory apparatus that stores data by accumulating charges in its capacitor, for example one disclosed in JP-A-2-3162, a memory cycle includes an active period and a non-active period. In this case, in the non-active period potentials in the pair of bit lines should be kept in balance and also should be precharged. In addition, the potential level of the precharge is set to one slightly lower than half of a power-supply potential Vcc depending on the characteristics (e.g., the threshold of potential) of a transistor to be used in a memory cell.

FIG. 3 is a signal waveform chart for illustrating the operation of the conventional semiconductor memory apparatus. In the figure, (a) represents signal waveforms of the respective bit lines BL, BL(bar) in the pair, and (b) represents a signal waveform of a word line WL. When the semiconductor memory apparatus is shifted into the non-active period, a precharge-instructing signal is brought into high. Then, a precharge-controlling circuit brings the pair of bit lines BL, BL(bar) into a conductive state to allow the bit lines BL, BL(bar) to be operated in balance. As shown in FIG. 3(a), the potential level of the pair of bit lines is Vcc×1/2, completing the balanced operation.

However, a voltage collector circuit lowers the final potential level of the pair of bit lines BL, BL(bar) by ΔV1 from Vcc/2 for attaining the operation of the semiconductor memory apparatus at a low potential.

In the semiconductor memory apparatus having the dynamic-type memory cell described above, there is a great problem of how to realize a high-speed access. However, the above conventional apparatus requires a waiting time period Δt1 until the potential level of the pair of bit lines BL, BL(bar) is lowered to Vcc/2 and is further lowered by ΔV1 after bringing the pair of bit lines BL, BL(bar) into a conductive state. Therefore, there is a problem in that the conventional semiconductor memory apparatus takes much time for attaining the operation at a low potential, resulting in a decrease in its processing speed.

For speeding up the processing speed, there is an idea of advancing the timing for bringing the pair of bit lines BL, BL(bar) into a conductive state. However, if the timing is advanced, the pair of bit lines BL, BL(bar) is brought into a conduction state in spite of insufficiently lowering the potential of the word line WL shown in FIG. 3(b). As a result, there is a possibility of causing a loss of data written in the memory cell. Therefore, it is impossible to advance the timing of bringing the pair of the bit lines BL, BL(bar) into conduction state.

SUMMARY OF THE INVENTION

Accordingly, the present invention has completed in consideration of the above facts. An object of the present invention is to provide a semiconductor memory apparatus that stores data by accumulating charges in its capacitor for allowing the operation thereof at a low potential and processing at a high speed.

For attaining the above object, in the first aspect of the present invention, a semiconductor memory apparatus for storing data by accumulating charges in a capacitor is provided, wherein before performing a precharge for bringing the potential of a pair of bit lines to an intermediate potential by making a short circuit in the pair of bit lines, the potential of the bit line being charged to a higher level is previously lowered to a level within the range that prevents data written in a memory cell from being disappeared.

In the second aspect of the present invention, a semiconductor memory apparatus for storing data by accumulating charges in a capacitor, comprises a forced step-down circuit comprised of a first switching element having one end connected to a driving line on the high side, and a forced step-down capacitor and a second switching element which are arranged in parallel between the other end of the first switching element and a ground potential, wherein the second switching element is brought into an on state in advance to hold the forced step-down capacitor at zero potential, and before performing a precharge for bringing the potential of a pair of bit lines to an intermediate potential by making a short circuit in the pair of bit lines, the first switching element is then brought into an on state and the potential of the driving line on the high side is previously lowered to a level within the range that prevents data written in a memory cell from being disappeared.

BRIEF DESCRIPTION OF THE DRAWINGS

FIG. 1 is a circuit diagram of a semiconductor memory apparatus having dynamic RAMs in accordance with one of preferred embodiments of the present invention;

FIG. 2 is a waveform chart in which a signal form of each part is illustrated for describing the operation of the semiconductor memory apparatus shown in FIG. 1, where (a) represents the signal waveforms of the respective bit lines BL, BL(bar), (b) represents the signal waveform of the word line WLa, (c) represents the waveform of a forced step-down control signal φ1 supplied to a gate of the first N-channel transistor N10 of the forced step-down circuit 11, (d) represents a waveform of a precharge-initiating signal φ2 supplied to the P-channel transistor P5 of the precharging circuit 10, and (e) represents the waveform of a forced step-down control signal φ3 supplied to a gate of the second N-channel transistor N11 of the forced step-down circuit 11; and FIG. 3 is a signal waveform chart for illustrating the operation of the conventional semiconductor memory apparatus, where (a) represents signal waveforms of the pair of bit lines BL, BL(bar), and (b) represents a signal waveform of a word line WL.

DETAILED DESCRIPTION OF PREFERRED EMBODIMENTS

[Configuration of the Preferred Embodiment]

Hereinafter, we will describe a semiconductor memory apparatus as one of preferred embodiments of the present invention with reference to the attached drawings.

Referring now to FIG. 1, there is shown a circuit diagram of a semiconductor memory apparatus equipped with dynamic RAMs as its memory cells in accordance with the present embodiment. The semiconductor memory apparatus of the present embodiment comprises a plurality of word lines WL, a plurality of pairs of bit lines BL, BL(bar), which are arranged in crossed state, and memory cells MC. Each of the memory cell MC comprises a pair of a transistor and a capacitor and is arranged on the intersection point between the word line WL and the bit line BL or BL(bar). In FIG. 1, for providing a simplified illustration, part of the memory cells is only shown.

As shown in the figure, furthermore, the semiconductor memory apparatus of the present embodiment further comprises a P-channel transistor P1 arranged between a driving line S1 on the higher potential side (i.e., a high-side driving line S1) and a power supply Vcc, an N-channel transistor N1 arranged between a driving line S2 on the lower potential side (i.e., a low-side driving line S2) and a ground potential, a precharging circuit 10 having a P-channel transistor P5 for precharging the pair of bit lines BL, BL(bar) to an intermediate potential, a forced step-down circuit 11 for forcefully stepping down the potential of the high-side driving line S1 before precharging with the precharging circuit 10, a sense-amplifier circuit 12 having two P-channel transistors P2, P3 and two N-channel transistors N2, N3 for sensing and amplifying a minute potential difference between bit lines BL, BL(bar) in the pair, and a hold circuit 13 for holding the driving line at a constant level after the precharge. Here, an N-channel transistor N4 and a P-channel transistor P4 are provided for shorting between the driving lines S1 and S2.

One of the characteristic features of the present embodiment is that the forced step-down circuit 11 is provided for lowering the potential of the high-side driving line S1 before precharging with the precharging circuit 10. The forced step-down circuit 11 comprises a first N-channel transistor N10, a second N-channel transistor N11, and a forced step-down capacitor C1. In the first N-channel transistor N10, one of its conductive terminals is connected to the high-side driving line S1. Also, the second N-channel transistor N11 and the forced step-down capacitor C1 are arranged in parallel between the other end of the terminals of the first N-channel transistor N10 and the ground earth.

The precharging circuit 10 makes a short circuit in the pair of bit lines BL, BL(bar) to precharge the potential of the pair of the bit lines BL, BL(bar) to an intermediate potential between the potential being stepped down by the forced step-down circuit 11 and the ground potential.

The sense amplifier circuit 12 detects a minute potential difference between the bit lines BL, BL(bar) in the pair caused by the readout operation from the memory cell MC. The bit line BL on the side (hereinafter, also referred as a high side) of reading out positive charge data stored in the memory cell MC is brought into connection with the driving line S1 to charge the bit line BL to a power-supply potential Vcc, while connecting the bit line BL(bar) to the driving line S2 to make the bit line BL(bar) into a ground potential.

Furthermore, the bit line BL on the side (hereinafter, also referred as a low side) of reading out the negative charge data stored in the memory cell MC is brought into connection with the driving line S2 to make the bit line BL a ground potential, while connecting the bit line BL(bar) to the driving line S1 to charge the bit line BL(bar).

When the potential of the pair of bit lines BL, BL(bar) is lowered to a predetermined potential by precharging with the precharging circuit 10, the holding circuit 13 holds the lowered potential as it is for a certain period of time.

Furthermore, with a predetermined timing shown in FIG. 2 described below, a forced step-down control signal φ1 is supplied to the N-channel transistor N10, a precharge-initiating signal φ2 is supplied to the P-channel transistor P5 of the precharging circuit, and a forced step-down control signal φ3 is supplied to the second N-channel transistor N11. Furthermore, with a predetermined timing, a control signal φ10 is supplied to the P-channel transistor P1, a control signal 11 is supplied to the N-channel transistor N1, and a control signal φ12 is supplied to the P-channel transistor P4. By the way, the configuration of each of the sense amplifier circuit 12, the precharging circuit 10, the holding circuit 13, and the memory cell MC is the same as that of the conventional one. Therefore, the details of these circuits will be omitted in the following description.

[Operation of the Embodiment]

Next, the operation of the semiconductor memory apparatus in accordance with the present embodiment will be described with reference to FIG. 2. In FIG. 2, there is shown a waveform chart in which a signal form of each part is illustrated for describing the operation of the semiconductor memory apparatus shown in FIG. 1. That is, in FIG. 2, the graph (a) represents the signal waveforms of the respective bit lines BL, BL(bar), (b) represents the signal waveform of the word line WLa, (c) represents the waveform of a forced step-down control signal φ1 supplied to a gate of the first N-channel transistor N10 of the forced step-down circuit 11, (d) represents a waveform of a precharge-initiating signal φ2 supplied to the P-channel transistor P5 of the precharging circuit 10, and (e) represents the waveform of a forced step-down control signal 3 supplied to a gate of the second N-channel transistor N11 of the forced step-down circuit 11.

If the precharge-initiating signal φ2 shown in FIG. 2(d) becomes high, then the P-channel transistor PS comes into an off state. As a result, the pair of bit lines BL, BL(bar) is released from its short-circuited state and comes into a floating state, shifting to an active period. In this state, the potential of the word line WLa shown in FIG. 2(b) increases and reaches to a predetermined potential, allowing the transistor of the memory cell MC to be brought into an on state. As a result, the potential of the bit line BL is slightly changed depending on the charges in the capacitor of the memory cell MC. At this time, the potential slightly increases when the memory cell stores "1". On the other hand, it slightly decreases when the memory cell stores "0". The reason why the high signal of the word line WLa is higher than the power-source potential Vcc is to sufficiently read out the data from the memory cell MC at a higher speed. The signal waveforms of the pair of bit lines BL, BL(bar) are shown in FIG. 2(a). The waveforms represent a situation in which the memory cell MC stores "1" (i.e., positive charges are stored in the capacitor). As the transistor of the memory cell MC comes into an on state, the charges stored in the capacitor of the memory cell MC are discharged. As a result, the potential of the bit line BL on the high side slightly increases (up to about 200 mV). The reason why only a slight increase in the potential is observed is that the capacity of the bit line BL is substantially higher than the capacity of the capacitor. By the way, the potential of the bit line BL(bar) is not changed since the transistor of the memory cell MC being connected to the bit line BL(bar) is held in an off-state.

The sense amplifier circuit 12 detects such a slight potential difference and brings the pair of bit lines BL, BL(bar) into connection with the respective driving lines S1 and S2 to amplify the potentials of the pair of bit lines BL, BL(bar) to their respective potentials (+3V, 0V). In addition, as the word line is being high, the amplified potential of the bit lines BL, BL(bar) is re-stored as charges in the capacitor of the memory cell MC.

After that, the N-channel transistor N11 comes into an on state as the forced step-down control signal φ3 is supplied to the N-channel transistor N11 at the time of being in the active period before turning the forced step-down control signal φ1 on. As a result, the charges of the capacitor C1 are discharged through the N-channel transistor N11. In such a state, the forced step-down control signal φ1 is brought into high at the time of which, or slightly after which the potential of the word line WLa decreases from the potential of the driving line to the threshold potential (Vt) or less of the transistor of the memory cell MC. The reason that the forced step-down control signal φ1 is brought into high with such timing is as follows. That is, at the time of writing "1" in the memory cell, the bit line BL is also at the same potential level, while the potential of the word line WL decreases from the potential of the driving line to the threshold potential Vt or less at that time. Therefore, it is possible to step down ΔV within the range of Vt and the data cannot be disappeared.

The N-channel transistor N10 is brought into an on state as the forced step-down control φ1 comes into high. As a result, depending on the level of the capacitor C1 as shown in FIG. 2(a), the potential of the driving line S1 and the potential of the bit line BL connected by the sense amplifier circuit 12 to the driving line S1 are lowered from the electric supply potential by ΔV. The difference ΔV is within the range at which the transistor of the memory cell MC to be used cannot be brought into an on state, depending on the threshold of such a transistor. In other words, the potential Vt of the transistor of the memory cell MC is in the range of about 0.5 volts to 1.0 volts, so that the transistor of the memory cell MC cannot be brought into an on state even though the potential of the bit line BL is 3 volts or less for example 2.5 volts or 2 volts. Therefore, the data stored in the memory cell MC cannot be disappeared. Furthermore, as the potential of the bit line BL on the high side will be decreased before long, there is no generation of any demerit even though the potential of the bit line BL is lowered ahead of time. Preferably, by lowering the potential of the bit line BL on the high side ahead of time, there is an effect of contributing to a decrease in electric power consumption. By the way, a sufficient pulse width of the forced step-down control signal φ1 may be about 5 nanoseconds.

If the potential of the driving line (the bit line BL) decreases by ΔV, then the precharge-initiating signal φ2 becomes low and the P-channel transistor P5 is brought into an on state. Then, a short circuit is occurred between the bit lines BL, BL(bar) in the pair, resulting in the precharge.

Referring again to FIG. 2, Δt denotes a waiting time period until the both bit lines BL, BL(bar) become their predetermined potentials from the initiation of precharge. When the pair of bit lines BL, BL(bar) reaches to the predetermined potentials after the expiration of the waiting time period Δt, the next reading and writing operations are permitted. After lowering the potential of the bit line BL to the predetermined level, the holding circuit 13 maintains such a decreased potential for a predetermined time period without causing variation in the lowered potential.

In the case of the conventional semiconductor memory apparatus described above, the pair of bit lines is brought into short circuit to shift the potential to an intermediate potential (3/2 volts=1.5 volts), followed by slightly lowering the potential, for example to 1.25 volts. However, it takes much time for lowering from an intermediate potential of 1.5 volts to 1.25 volts, so that a long waiting time period (Δt1) has been required for allowing a subsequent access after shortening the pair of bit lines BL, BL(bar). In the present embodiment, on the other hand, after lowering the bit line BL on the high side from 3 volts to for example 2.5 volts prior to the short-circuit between the bit lines BL, BL(bar) in the pair, the pair of bit lines BL, BL(bar) is short circuited. Consequently, the potential of each bit line reaches to a target intermediate potential (2.5/2 volts=1.25 volts) with an extremely short waiting time period Δt. The reason why the waiting time period Δt is substantially shorter than usual is as follows. That is, in the case of the conventional semiconductor memory apparatus, the potential is further lowered after shortening the pair of bit lines BL, BL(bar) and thus the potentials of both the bit lines BL, BL(bar) should be lowered, resulting in a heavy load. In the semiconductor memory apparatus of the present embodiment, the potential of only one bit line of the pair (i.e., the bit line BL on the high side) is lowered. Therefore, the amount of the load can be reduced by half compared with the conventional one. In the case of the present embodiment, furthermore, the potential of the bit line BL is lowered from 3 volts to 2.5 volts in advance. That is, the potential is lowered from a higher level compared with the conventional semiconductor memory apparatus in which the potential is lowered from 1.5 volts to 1.25 volts. Therefore, the potential can be lowered within a shorter time period compared with the conventional one.

The reason why the potential at the time of causing a short circuit between the bit lines BL, BL(bar) in the pair is brought into a level lower than the intermediate potential (1.5 volts) between the bit lines in the pair is to facilitate lowering of the potential. That is, when the potential is lowered, the potential at the time of reading out the data of "1" stored in the memory cell is also lowered. Conventionally, such a potential is lowered from 5 volts to 3 volts. Recently, it is further lowered to 2.5 volts. At the time of reading out "1" stored in the memory cell, there is a need to adjust the potential of the word line to 1.5 volts plus Vt if the potential at the time of shortening the pair of bit lines is 1.5 volts. Furthermore, if Vt=0.7 volts, the data of "1" cannot read out from the memory cell until the potential of the word line is pulled up to 2.2 volts, so that lowering of the potential cannot be attained. In contrast, if the potential of the bit line is lowered at the time of precharging, for example if the potential at the time of shortening the pair of bit lines is 1.25 volts, the readout becomes possible when the potential of the word line is 1.25 volts plus Vt (0.7 volts)=1.95 volts. Comparing with the case in which the potential at the time of shortening the pair of bit lines is 1.5 volts, it becomes possible to be actuated at a 0.25-volt lower potential, allowing a decrease in the potential of the operation. Consequently, it becomes possible to speed-up the rate of readout from the memory cell.

In summary, the conventional semiconductor memory apparatus takes substantially much time to lower the potential of the bit line to a predetermined potential because of the follows. That is, the pair of bit lines is short circuited after bringing the transistor of the memory cell completely into an off state. When the bit line reaches to an intermediate potential, the potential is lowered to a predetermined potential by a voltage collector circuit. On the other hand, the semiconductor memory apparatus of the present embodiment is able to not only make a short circuit in the pair of bit lines but also lower the potential of the bit line on the high side to a predetermined potential to lower the potential of the bit line on the high side to the predetermined potential within an extremely short time at the time of making a short circuit in the pair of the bit lines. According to the present embodiment, therefore, it becomes possible to provide a semiconductor memory apparatus which can be operated at a lower potential while processing at a high speed.

[Other Embodiments]

The present invention is not limited to the above embodiment. Various modifications and changes of the present invention will be appreciated by persons skilled in the art without departing from the scope and the spirit of the present invention. For instance, in the above embodiment, before making a short circuit in the pair of bit lines, the driving line S1 is grounded through two N-channel transistors N10, N11 and the capacitor C1 at the time of lowering the potential of the bit line on the high side. Alternatively, it may be grounded through two P-channel transistors and the capacitor.

In the above embodiment, the case in which the power-supply potential Vcc is 3 volts is described. Alternatively, the power-supply potential Vcc may be lower than 3 volts or higher than 3 volts.

Furthermore, the present invention is not limited to the above embodiment. The present invention can be applied not only on the semiconductor memory apparatus having DRAM but also on any semiconductor memory apparatus as far as it includes a dynamic type memory and a bit line thereof can be precharged.

According to the present invention, therefore, before precharging for the next cycle of read and write, the potential of the bit line being charged on the high side is previously lowered to a level within the range that prevents the data written in the memory cell from being disappeared to allow the potentials of the pair of bit lines to their respective predetermined potentials within an extremely short time at the time of precharging. Therefore, it becomes possible to provide a semiconductor memory apparatus which can be operated at a lower potential while processing at a high speed.

What is claimed is:

1. A method for storing data by accumulating charges in a capacitor, comprising:

before performing a precharge for bringing the potential of a pair of bit lines to an intermediate potential by making a short circuit in the pair of bit lines, the potential of the bit line being charged to a higher level is previously lowered to a level within the range that prevents data written in a memory cell from being disappeared lowering a potential of a first bit line of a pair of bit lines to a level within a range that prevents data in a memory cell from being lost; and making a short circuit between said pair of bit lines to perform a precharge of said pair of bit lines by bringing the potential of said pair of bit lines to an intermediate potential, wherein said short circuit is made after said lowering occurs.

2. A semiconductor memory apparatus for storing data by accumulating charges in a capacitor, comprising:

a forced step-down circuit comprised of comprising a first switching element having one end connected to a driving line on the high side, and a forced step-down capacitor and a second switching element arranged in parallel between the other end of the first switching element and a ground potential, and a pair of bit lines, wherein a first bit line of said pair of bit lines is connected to said driving line, wherein the second switching element is brought into an on state in advance to hold the forced step-down capacitor at zero potential before the first switching element is brought into an on state, and before making a short circuit in the pair of hit lines to perform performing a precharge for by bringing a potential of a pair of bit lines to an intermediate potential by making a short circuit in the pair of bit lines, the first switching element is then brought into an on state to lower and a potential of the driving line on the high side is previously lowered to a level within the a range that prevents of preventing data written in a memory cell from being lost disappeared.

3. A method for storing data in a semiconductor memory apparatus by accumulating charges in a capacitor, said semiconductor memory apparatus having a forced step-down circuit comprising:

a first switching element having one end connected to a driving line on the high side, a forced step-down capacitor and a second switching element arranged in parallel between the other end of the first switching element and a ground potential, and a pair of bit lines, wherein a first bit line of said pair of bit lines is connected to said driving line, said method comprising:

bringing said second switching element into an on state to hold the forced step-down capacitor at zero potential;

lowering a potential of said first bit line to a level within a range that prevents data in a memory cell from being lost by bringing said first switching element into an on state after bringing said second switching element into an on state; and making a short circuit between said pair of bit lines to perform a precharge of said pair of bit tines by bringing the potential of said pair of bit lines to an intermediate potential.

4. The method of claim 1, wherein the intermediate potential is less than 1.5 volts.

5. The method of claim 1, wherein the intermediate potential is from about 1 volt to about 1.25 volts.

6. The method of claim 1, wherein the potential of said first bit line is lowered to a potential from about 2.0 volts to about 2.5 volts.

7. The method of claim 1, wherein said range that prevents data in a memory cell from being lost is defined by a threshold voltage associated with the memory cell.

8. The method of claim 1, wherein making a short circuit comprises bringing a switching element connected to both bit lines of said pair of bit lines into an on state.

9. The semiconductor memory apparatus of claim 2, wherein the intermediate potential is less than 1.5 volts.

10. The semiconductor memory apparatus of claim 2, wherein the intermediate potential is from about 1 volt to about 1.25 volts.

11. The semiconductor memory apparatus of claim 2, wherein the potential of said first bit line is lowered to a potential from about 2.0 volts to about 2.5 volts.

12. The semiconductor memory apparatus of claim 2, wherein said range that prevents data in a memory cell from being lost is defined by a threshold voltage associated with the memory cell.

13. The semiconductor memory apparatus of claim 2, wherein making a short circuit comprises bringing a switching element connected to both bit lines of said pair of bit lines into an on state.

14. The method of claim 3, wherein the intermediate potential is less than 1.5 volts.

15. The method of claim 3, wherein the intermediate potential is from about 1 volt to about 1.25 volts.

16. The method of claim 3, wherein the potential of said first bit line is lowered to a potential from about 2.0 volts to about 2.5 volts.

17. The method of claim 3, wherein said range that prevents data in a memory cell from being lost is defined by a threshold voltage associated with the memory cell.

18. The method of claim 3, wherein making a short circuit comprises bringing a switching element connected to both bit lines of said pair of bit lines into an on state.

* * * * *

UNITED STATES PATENT AND TRADEMARK OFFICE
CERTIFICATE OF CORRECTION

PATENT NO.   : 6,797,997 B2
DATED        : September 28, 2004
INVENTOR(S)  : Yoji Hata et al.

It is certified that error appears in the above-identified patent and that said Letters Patent is hereby corrected as shown below:

Column 7,
Lines 30-47, claim 1 should read as follows:
-- 1. A method for storing data by accumulating charges in a capacitor, comprising:
lowering a potential of a first bit line of a pair of bit lines to a level within a range that prevents data in a memory cell from being lost; and
making a short circuit between said pair of bit lines to perform a precharge of said pair of bit lines by bringing the potential of said pair of bit lines to an intermediate potential,
wherein said short circuit is made after said lowering occurs. --.

Column 7, lines 48-67 to Column 8, lines 1-3, change claim 2 as follows:
-- 2. A semiconductor memory apparatus for storing data by accumulating charges in a capacitor, comprising:
a forced step-down circuit comprising a first switching element having one end connected to a driving line on the high side,
a forced step-down capacitor and a second switching element arranged in parallel between the other end of the first switching element and a ground potential, and
a pair of bit lines, wherein a first bit line of said pair of bit lines is connected to said driving line, wherein
the second switching element is brought into an on state to hold the forced step-down capacitor at zero potential before the first switching element is brought into an on state, and
before making a short circuit in the pair of bit lines to perform a precharge by bringing a potential of a pair of bit lines to an intermediate potential, the first switching element is brought into an on state to lower a potential of the driving line on the high side to a level within a range that prevents data written in a memory cell from being lost. --.

Signed and Sealed this

Twenty-first Day of March, 2006

JON W. DUDAS
*Director of the United States Patent and Trademark Office*